June 21, 1966 R. L. WHITE 3,257,566

COMPLEMENTARY CONTROLLED RECTIFIER SWITCH

Filed Aug. 21, 1961

RICHARD L. WHITE
*INVENTOR.*

BY M. Jabin

ATTORNEY.

United States Patent Office 3,257,566 Patented June 21, 1966

3,257,566

COMPLEMENTARY CONTROLLED RECTIFIER SWITCH

Richard L. White, Glendora, Calif., assignor to Hoffman Electronics Corporation, a corporation of California Filed Aug. 21, 1961, Ser. No. 132,792
2 Claims. (Cl. 307—88.5)

The present invention relates to electronic switches, and more particularly to controlled rectifier switches.

The controlled rectifier has firmly established itself in the semiconductor industry and shows promise of being useful in ever-increasing fields of application. Its use as a replacement for the thyratron dramatizes its wide acceptance in circuits requiring high power switching. In many applications, the controlled rectifier will render virtually obsolete, and establish as impractical, the use of relays, power transistors, and high current rectifiers, as well as the above-mentioned thyratron.

Basically, the controlled rectifier is a solid state device which may be used for switching high current circuits. Similar to the conventional switch, it has both an "on" and an "off" state. The switching or gate current required is but a fraction of its total current carrying capability.

Its operation may be compared to that of NPN transistor ($T_1$) directly coupled to a PNP transistor ($T_2$), where the base current of $T_1$ is equivalent to the gate current of the controlled rectifier. With the base of $T_1$ connected to the collector of $T_2$, and the base of $T_2$ connected to the collector of $T_1$, a closed loop with gain $\beta_1\beta_2$ is formed. This closed-loop gain is the key to operation of the controlled rectifier. With $T_1$ base current at zero, loop gain will be less than one, but as $T_1$ base current increased, an increase of collector current occurs and gain increases. This process continues with an increase in $T_1$ base current until loop gain equals one. The circuit then becomes self-regenerative, driving collector currents of both transistors $T_1$ and $T_2$ toward saturation. In the controlled rectifier counterpart, a loop gain $\beta_1\beta_2<1$ represents the "off" state, whereas $\beta_1\beta_2\geqq1$ represents the "on" state.

The reverse characteristic of a conventional controlled rectifier is similar to that of any diode. In the forward direction, leakage conduction, which is caused by collector currents of $T_1$ and $T_2$ during the period when $\beta_1\beta_2<1$, increases until the forward breakover point is reached, where $\beta_1\beta_2\geqq1$, and forward voltage then drops to a very low level, while forward current becomes essentially dependent upon load.

The use of different gate currents affects the forward breakover voltage as well as leakage current. As gate current is increased, leakage current increases and breakover voltage decreases.

It is an object of the present invention to provide a novel controlled rectifier switch.

It is another object of the present invention to provide a controlled rectifier switch having few components, a small voltage drop during conduction, and little dissipation of power.

According to the present invention, a controlled rectifier switch comprises an NPNP controlled rectifier connected across a PNPN controlled rectifier and oppositely poled with respect thereto. The PNPN controlled rectifier requires a positive gate current, and the NPNP controlled rectifier requires a negative gate current.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings in which:

Figure 1:
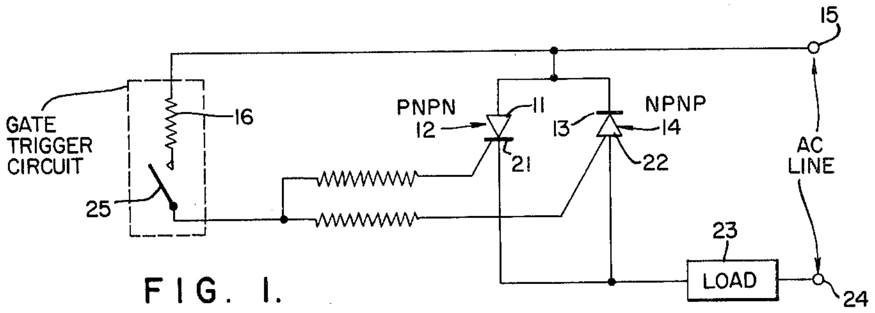
FIGURE 1 is a schematic diagram of a circuit according to the present invention.

Referring now the drawings, FIGURE 1 shows anode 11 of conventional PNPN silicon controlled rectifier 12 connected to cathode 13 of complementary NPNP silicon controlled rectifier 14. The junction between anode 11 and cathode 13 is connected to terminal 15 and resistor 16. Cathode 21 of controlled rectifier 12 is connected to anode 22 of controlled rectifier 14, and the junction therebetween is connected to one end of load 23, the other end of which is connected to terminal 24. The control electrodes of controlled rectifiers 12 and 14 are coupled together and to one end of switch 25, the other end of which is connected to resistor 16.

Figure 2:
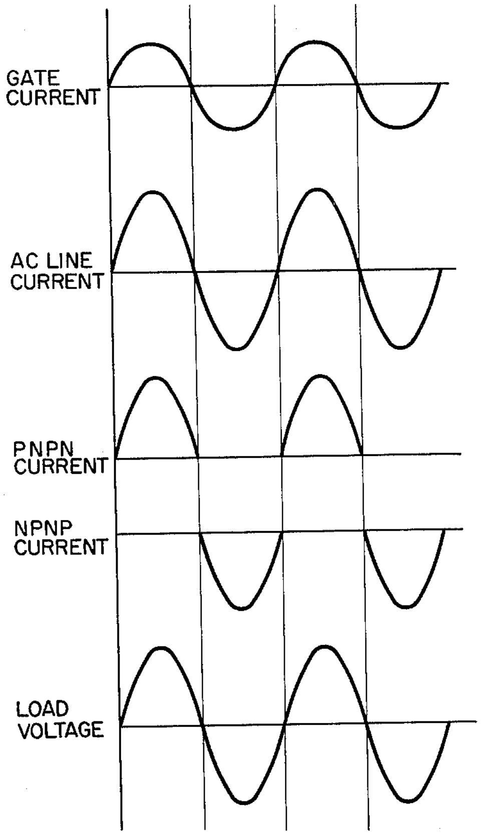
FIG. 2 is a graph of the waveshapes present in the circuit of FIGURE 1.

With terminals 15 and 24 connected across an A.C. line and switch 25 closed, PNPN controlled rectifier 12 conducts when terminal 15 is positive, and NPNP controlled rectifier 14 conducts when terminal 24 is negative. The waveshapes are shown in FIGURE 2, which is self-explanatory.

Figure 3:
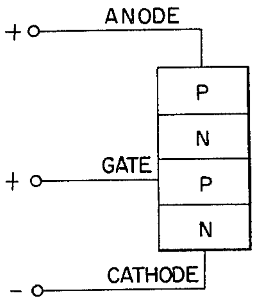
FIGURE 3 shows a conventional PNPN controlled rectifier.
Figure 4:
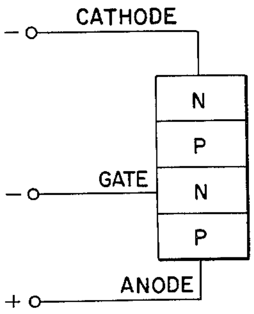
FIGURE 4 shows a complementary NPNP controlled rectifier.

FIGURE 3 shows the physical arrangement of conventional PNPN controlled rectifier 12, and FIGURE 4 shows the physical arrangement of complementary NPNP controlled rectifier 14. NPNP controlled rectifier 14 is a complementary controlled rectifier in that is has cathode and anode electrodes connected to its N and P regions, respectively, and a control electrode connected to its inner N-type region. Controlled rectifier 14 is thus complementary to conventional PNPN controlled rectifier 12, which has anode and cathode electrodes connected to its outer P and N regions, respectively, and a control electrode connected to its inner P-type region. Complementary controlled rectifier 14 requires negative gate current triggering, while conventional controlled rectifier 12 requires positive gate triggering.

A complementary controlled rectifier can be made as follows: diffuse a P-type silicon wafer with a donor material such as phosphorous, to form an N-type region all around the wafer. The silicon dioxide coating that invariably forms on the outside should be etched away, along with a little of the underlying N-type region, on one surface. Diffuse the device with an acceptor material such as boron, to form a P-type region on the exposed N-type region. The silicon dioxide coating will have masked all the surfaces, except the one surface that was etched. The sides of the device should then be etched, to remove the N-type region therefrom, leaving a four-layer device. Etch a hole through the P-type region to expose the underlying N-type region, so that a gate electrode can be connected thereto. Then connect anode and cathode electrodes to the end layers.

The circuit shown and described is very useful as an A.C. power relay. The circuit requires only two active elements and only one power-consuming element, since each controlled rectifier consumes power during only one-half of the alternating current cycle. It is very adaptable for miniaturization, has only a small voltage drop during conduction, and has low power consumption. It also has a high on/off ratio. When the controlled rectifiers are not conducting, the only current flowing is the reverse leakage current. An additional advantage of the circuit shown in FIGURE 1 is that the trigger is always common to only one side of the A.C. input.

It is to be understood that the gate trigger circuit formed by resistor 16 and switch 25 could be replaced by other trigger circuits, such as a transformer operated by an external A.C. input.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

I claim:

1. A full-wave switch for alternating current loads, comprising a PNPN controlled rectifier having an anode, a cathode and a control electrode; an NPNP controlled rectifier having an anode, a cathode and a control electrode; said rectifiers having their respective anode-cathode paths reversely connected in parallel with one another and together in series with a load and an alternating current supply; and a common control circuit connected between one terminal of the alternating current supply and both of said control electrodes.

2. A full-wave switch for alternating current loads, comprising a PNPN controlled rectifier having an anode, a cathode and a control electrode; a NPNP controlled rectifier having an anode, a cathode and a control electrode; said rectifiers having their respective anode-cathode paths reversely connected in parallel with one another and together in series with a load and an alternating current supply; and a common control circuit connected through resistors between said respective control electrodes and one terminal of the alternating current supply.

References Cited by the Examiner

UNITED STATES PATENTS 2,745,038 5/1956 Sziklai ............ 307—88.5
3,114,097 12/1963 Clarke.

OTHER REFERENCES

Blake: "Designing Solid-State Static Power Relays," reprinted from Electronics, May 27, 1960, vol. 33, No. 22, pp. 114–117.

Frenzel: "Solid State Thyratron Switches Kilowatts," reprinted from Electronics, March 1958, 4 pages.

International Dictionary of Physics and Electronics, Van Nostrand, second edition 1961 (page 87 relied on).

ARTHUR GAUSS, *Primary Examiner.*

GEORGE N. WESTBY, *Examiner.*